(12) United States Patent
Huang et al.

(10) Patent No.: US 11,681,843 B2
(45) Date of Patent: Jun. 20, 2023

(54) INPUT DATA COMPRESSION FOR MACHINE LEARNING-BASED CHAIN DIAGNOSIS

(71) Applicant: Siemens Industry Software Inc., Plano, TX (US)

(72) Inventors: Yu Huang, West Linn, OR (US); Gaurav Veda, Hillsboro, OR (US); Kun-Han Tsai, Lake Oswego, OR (US); Wu-Tung Cheng, Lake Oswego, OR (US); Mason Chern, Minxiong Township, Chiayi County (TW); Shi-Yu Huang, Hsinchu (TW)

(73) Assignee: Siemens Industry Software Inc., Plano, TX (US)

(*) Notice: Subject to any disclaimer, the term of this patent is extended or adjusted under 35 U.S.C. 154(b) by 1192 days.

(21) Appl. No.: 16/248,849

(22) Filed: Jan. 16, 2019

(65) Prior Publication Data
US 2019/0220745 A1 Jul. 18, 2019

Related U.S. Application Data

(60) Provisional application No. 62/618,618, filed on Jan. 17, 2018.

(51) Int. Cl.
*G06F 30/333* (2020.01)
*G01R 31/317* (2006.01)
(Continued)

(52) U.S. Cl.
CPC ....... *G06F 30/333* (2020.01); *G01R 31/3177* (2013.01); *G01R 31/31704* (2013.01);
(Continued)

(58) Field of Classification Search
CPC ....... G06F 30/30; G06F 30/333; G06N 20/00; G06N 3/08; G06N 3/0454;
(Continued)

(56) References Cited

U.S. PATENT DOCUMENTS

| | | | |
|---|---|---|---|
| 7,412,633 B2* | 8/2008 | Kimelman | G01R 31/318572 714/724 |
| 7,475,308 B2* | 1/2009 | Anderson | G01R 31/318569 714/726 |

(Continued)

OTHER PUBLICATIONS

Tanwir et al.; "An online framework for diagnosis of multiple defects in scan chains"; 2018 19th International Symposium on Quality Electronic Design (ISQED); Year: 2018 | Conference Paper | Publisher: IEEE (Year: 2018).*

(Continued)

*Primary Examiner* — Helen Rossoshek

(57) ABSTRACT

Various aspects of the disclosed technology relate to machine learning-based chain diagnosis. Faults are injected into scan chains in a circuit design. Simulations are performed on the fault-injected circuit design to determine test response patterns in response to the test patterns which are captured by the scan chains. Observed failing bit patterns are determined by comparing the unloaded test response patterns with corresponding good-machine test response patterns. Bit-reduction is performed on the observed failing bit patterns to construct training samples. Using the training samples, machine-learning models for faulty scan cell identification are trained. The bit reduction comprises pattern-based bit compression for good scan chains or cycle-based bit compression for the good scan chains. The bit reduction may further comprise bit-filtering. The bit-filtering may comprises keeping only sensitive bits on faulty scan chains for the training samples construction.

21 Claims, 13 Drawing Sheets

(51) Int. Cl.
*G06N 20/00* (2019.01)
*G01R 31/3177* (2006.01)
*G01R 31/3185* (2006.01)
*G01R 31/3183* (2006.01)
*G06F 30/30* (2020.01)

(52) U.S. Cl.
CPC ........... *G01R 31/318342* (2013.01); *G01R 31/318547* (2013.01); *G01R 31/318583* (2013.01); *G06F 30/30* (2020.01); *G06N 20/00* (2019.01)

(58) Field of Classification Search
CPC .......... G01R 31/31704; G01R 31/3177; G01R 31/318342; G01R 31/318583; G01R 31/318547
See application file for complete search history.

(56) References Cited

U.S. PATENT DOCUMENTS

| | | | | |
|---|---|---|---|---|
| 7,486,205 B2* | 2/2009 | Wegener | ......... | G01R 31/31921 714/732 |
| 7,725,849 B2* | 5/2010 | Abercrombie | ......... | G06F 30/30 714/724 |
| 7,729,884 B2* | 6/2010 | Huang | ......... | G06F 11/267 702/185 |
| 7,877,715 B1* | 1/2011 | Thirunavukarasu | | G01R 31/318533 716/136 |
| 7,890,827 B2* | 2/2011 | Rajski | ......... | G01R 31/318583 714/732 |
| 8,010,856 B2* | 8/2011 | Cannon | ......... | G01R 31/318536 714/728 |
| 8,086,924 B2* | 12/2011 | Forlenza | ......... | G01R 31/318547 714/733 |
| 8,280,687 B2* | 10/2012 | Cheng | ......... | G01R 31/318547 702/185 |
| 8,280,688 B2* | 10/2012 | Huang | ......... | G01R 31/318547 702/185 |
| 8,402,397 B2* | 3/2013 | Robles | ......... | G06F 30/398 716/54 |
| 8,504,949 B2* | 8/2013 | Robles | ......... | G06F 30/398 716/52 |
| 8,645,780 B2* | 2/2014 | Wohl | ......... | G01R 31/318547 714/732 |
| 8,719,651 B1* | 5/2014 | Dev | ......... | G01R 31/318583 716/108 |
| 8,843,796 B2 | 9/2014 | Cheng et al. | | |
| 9,086,459 B2* | 7/2015 | Guo | ......... | G01R 31/318583 |
| 9,135,103 B2 | 9/2015 | Huang et al. | | |
| 9,244,125 B2* | 1/2016 | Huang | ......... | G01R 31/318541 |
| 9,638,742 B2* | 5/2017 | Suto | ......... | G01R 31/2815 |
| 10,768,231 B2* | 9/2020 | Bernard | ......... | G01R 31/318566 |
| 10,796,043 B1* | 10/2020 | Huang | ......... | G06F 30/333 |
| 11,361,248 B2* | 6/2022 | Huang | ......... | G01R 31/3177 |
| 2008/0103710 A1* | 5/2008 | Wegener | ......... | H03M 7/30 324/76.38 |
| 2009/0210761 A1* | 8/2009 | Forlenza | ......... | G06F 11/267 714/E11.169 |
| 2010/0005041 A1* | 1/2010 | Wang | ......... | G01R 31/2894 716/106 |
| 2016/0323143 A1* | 11/2016 | Kim | ......... | G06F 3/0604 |
| 2017/0185733 A1* | 6/2017 | Nogueira | ......... | A61B 5/14735 |
| 2019/0220776 A1* | 7/2019 | Huang | ......... | G01R 31/31704 |

OTHER PUBLICATIONS

Huang et al.; "Diagnose Multiple Stuck-at Scan Chain Faults"; 2008 13th European Test Symposium; Year: 2008 | Conference Paper | Publisher: IEEE; Cited by: Papers (7) (Year: 2008).*

Y. Huang, B. Benware, R. Klingenberg, H. Tang, Jayant Dsouza and W.-T. Cheng, "Scan Chain Diagnosis Based on Unsupervised Machine Learning", Proc. of Asian Test Symp. (ATS), 2017, pp. 1-6.

J. Li, Y. Huang, W.-T. Cheng, C. Schuermyer, and D. Xiang, "A Supervised ANN Method for Memory Failure Signature Classification", IEEE Proc. of Solid-State and Integrated Circuit Technology, 2012, pp. 1-3.

* cited by examiner chain pattern 001100110011

| Fault Models | Unloaded Values with One Permanent Faults | Unloaded Values with One Intermittent Fault (Examples) |
|---|---|---|
| Slow-to-Rise | 001<u>0</u>001<u>0</u>001X | 0011001<u>0</u>001X |
| Slow-to-Fall | 0<u>1</u>110<u>1</u>110<u>1</u>1X | 0<u>1</u>110011011X |
| Slow | 0<u>1</u>1<u>0</u>0110<u>0</u>11X | 001<u>0</u>0<u>1</u>11011X |
| Fast-to-Rise | X011<u>1</u>011<u>1</u>011 | X011<u>1</u>0110011 |
| Fast-to-Fall | X0<u>0</u>100<u>0</u>100<u>0</u>1 | X0<u>0</u>100110<u>0</u>1 |
| Fast | X0<u>0</u>1<u>1</u>00<u>1</u>100<u>1</u> | X0<u>0</u>10011<u>0</u>01 |
| Stuck-at-0 | 000<u>0</u>0000<u>0</u>000 | 001<u>0</u>0001<u>0</u>00<u>0</u> |
| Stuck-at-1 | 111<u>1</u>1111<u>1</u>111 | <u>1</u>0111111<u>0</u>11 |

FIG. 3

INPUT DATA COMPRESSION FOR MACHINE LEARNING-BASED CHAIN DIAGNOSIS

RELATED APPLICATIONS

This application claims the benefit of U.S. Provisional Patent Application No. 62/618,618, filed on Jan. 17, 2018, titled "Input Data Compression For Machine Learning-Based Chain Diagnosis," and naming Yu Huang et al. as inventors, which application is incorporated entirely herein by reference.

FIELD OF THE DISCLOSED TECHNIQUES

The presently disclosed techniques relates to circuit testing, defect diagnosis and yield analysis. Various implementations of the disclosed techniques may be particularly useful for identifying defective scan cells.

BACKGROUND OF THE DISCLOSED TECHNIQUES

Scan chains and their associated clock circuitry occupy a significant portion of the layout of an integrated circuit. Consequently, defective scan chains is often a major source of circuit failures. It has been reported that defects occurring on scan chains account for about 30% to 50% of all failing chips. Therefore, scan chain diagnosis is important for yield learning and improvement in a semiconductor manufacture process.

Physical failure analysis instruments, combined with a tester, are sometimes used to search for defective responses along scan chains. These hardware-based methods often rely on specially-designed scan chains and scan cells. While effective in isolating scan chain defects, the requirement of extra hardware may not be acceptable in many realistic products. Further, it is difficult to apply these methods to chips with embedded compression circuits without resorting to a bypass mode.

Software-based techniques use algorithmic diagnosis procedures to identify failing scan cells. It may run chain diagnosis with conventional scan chains with or without embedded compressions. The current software-based chain diagnosis techniques may be further classified into two categories: model-based algorithms and data-driven algorithms. In a model-based chain diagnosis process, fault models and pattern simulation are used. In a data-driven chain diagnosis process, signal profiling, filtering and edge detections are applied. Each category of algorithms has its own advantages and disadvantages. These two can also be combined to increase diagnosis resolution and accuracy. While conventional methods may achieve satisfactory results for a defect behaving exactly like a modeled fault (e.g. stuck-at-0 fault at a scan cell's output), a defect in a scan chain often exhibits un-modeled faulty behavior (e.g. intermittent faulty behavior). For the un-modeled faults, both the diagnostic accuracy and resolution could degrade significantly.

Machine learning can be employed to address the un-modeled faulty behavior for chain diagnosis. If unloaded test response patterns are treated as failure images, then faulty scan cell identification is like image recognition. However, a failure image can have too many "pixels" to be used directly as the input vector for a machine-learning model. A large circuit nowadays has tens of millions of scan cells, which may be divided into hundreds of thousands of scan chains. Several thousands of test patterns are typically generated for testing circuits. Multiplying these numbers together (number of scan cells x number of test patterns), the total number of components of the input vector for a machine learning model can reach ten billion. This is too big for a typical computer system used by a semiconductor company to handle. "Image compression/reduction" techniques are needed for applying machine learning to chain diagnosis.

BRIEF SUMMARY OF THE DISCLOSED TECHNIQUES

Various aspects of the disclosed technology relate to machine learning-based chain diagnosis. In one aspect, there is a method, executed by at least one processor of a computer, comprising: receiving a circuit design and test patterns for testing circuits manufactured based on the circuit design; preparing training samples based on the circuit design and the test patterns, comprising: injecting faults into scan chains in the circuit design, performing simulations on the fault-injected circuit design to determine test response patterns in response to the test patterns which are captured by the scan chains, determining unloaded test response patterns, the unloaded test response patterns being patterns obtained by shifting the test response patterns out of the scan chains, determining observed failing bit patterns based on comparing the unloaded test response patterns with corresponding good-machine test response patterns, and performing bit-reduction on the observed failing bit patterns for each of the fault injections to construct training samples, the bit-reduction comprising pattern-based bit compression for good scan chains or cycle-based bit compression for the good scan chains, the good scan chains being scan chains with no fault being injected into, the pattern-based bit compression comprising combining, for each of the fault injections, bits within each of the observed failing bit patterns and being associated with scan cells on each of the good scan chains, combining, for each of the fault injections, corresponding bits associated with the good scan chains across the observed failing bit patterns; training machine-learning models for faulty scan cell identification using the training samples; and storing the trained machine-learning models.

The method may further comprise: using the trained machine-learning models to identify defective scan cell candidates for circuits having failed manufacture tests; and locating defects in one or more of the circuits having failed manufacture tests based on the defective scan cell candidates. The locating may comprises: using a physical failure analysis tool to analyze the one or more of the circuits having failed manufacture tests.

The bit-reduction may further comprise: the pattern-based bit compression for faulty scan chains or the cycle-based bit compression for the faulty scan chains, the faulty scan chains being scan chains with the faults being injected into.

The bit-reduction may further comprise bit filtering. The bit filtering may comprise: removing bits of the compressed observed failing bit patterns that are associated with scan cells that have no logic path to any scan cells on a faulty scan chain from the training samples construction or removing bits that never fail for any of the test patterns or for any of the fault injections into a faulty scan chain from the training samples construction.

Alternatively or additionally, the bit filtering may comprise: keeping only sensitive bits on the faulty scan chains for the training samples construction.

The combining in the pattern-based bit compression and in the cycle-based bit compression may comprise: performing bit addition, wherein the observed failing bit patterns use "1" and "0" to represent a failing bit and a non-failing bit, respectively, or computing observed bit failing probability values based on the observed failing bit patterns.

The machine-learning models may be Artificial Neural Networks. The faults being injected are represented by fault types and fault probabilities.

In another aspect, there are one or more non-transitory computer-readable media storing computer-executable instructions for causing one or more processors to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 3 illustrates unloaded patterns for eight permanent fault models and eight intermittent fault models obtained by shifting in and out a chain pattern, "001100110011."

DETAILED DESCRIPTION OF THE DISCLOSED TECHNIQUES

Various aspects of the disclosed technology relate to machine learning-based chain diagnosis. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "perform," "inject," and "determine" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Figure 1:
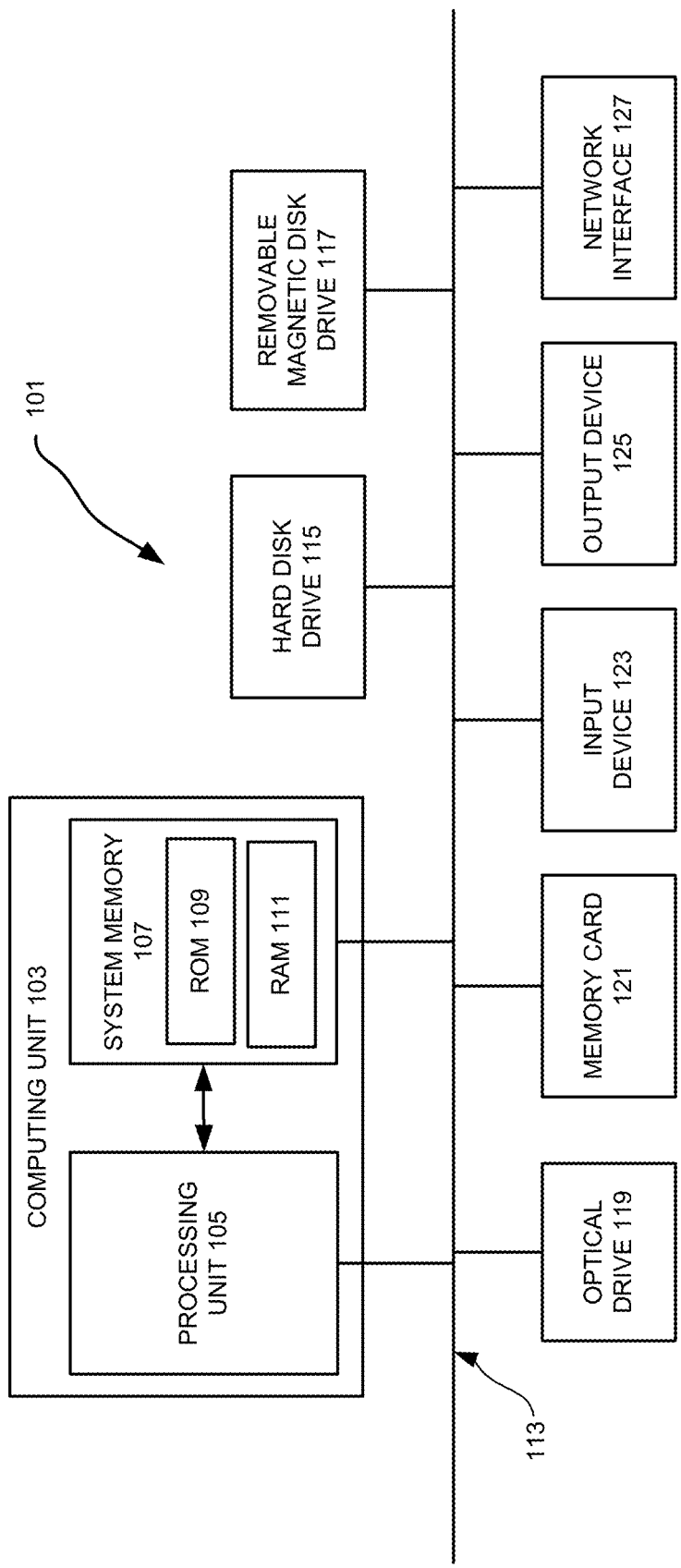
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is an error caused in a device during the manufacturing process. A fault model is a description of how a defect alters design behavior. In another word, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file, or failure report). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Diagnosis includes logic diagnosis (sometimes referred to as scan diagnosis or diagnosis) and chain diagnosis. Logic diagnosis may employ a fault dictionary or directly examine the syndrome (i.e., the effect) of the failing chip to determine likely defect locations (defect suspects). The latter approach may include structural pruning (backtracing), fault injection, and evaluation (fault simulation for both failing and passing test patterns). The quality of diagnosis can be measured by diagnostic resolution (the number of the real defects vs. the number of the defect suspects). Diagnostic resolution is linked not only to the algorithm used for diagnosis but also to the test patterns used for the manufacturing test (manufacturing test patterns). To enhance the diagnosis quality, a diagnostic test pattern generation process may be employed. This process generates test patterns that can refine the set of defect suspects.

Chain diagnosis determines scan cells that are likely to be defective. In a chain diagnosis process, two types of test patterns may be used. The first type is called chain patterns. A chain pattern is a pattern used in a process comprising shift-in and shift-out without pulsing capture clocks. The other type is often referred to as scan patterns. A scan pattern is a pattern used in a process comprising shift-in, one or multiple capture clock cycles, and shift-out, and the scan patterns include patterns generated by ATPG for testing system logic, special chain diagnostic patterns generated only for scan chain diagnosis purpose and some special functional patterns. Chain patterns can be used to test the integrity of scan chains and/or determine fault models associated with faulty scan chains while scan patterns can be used to inject certain values to some scan cells for locating defective scan cells.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can reduce not only the amount of data stored on the tester but also the test time for a given test data bandwidth.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

Figure 2:
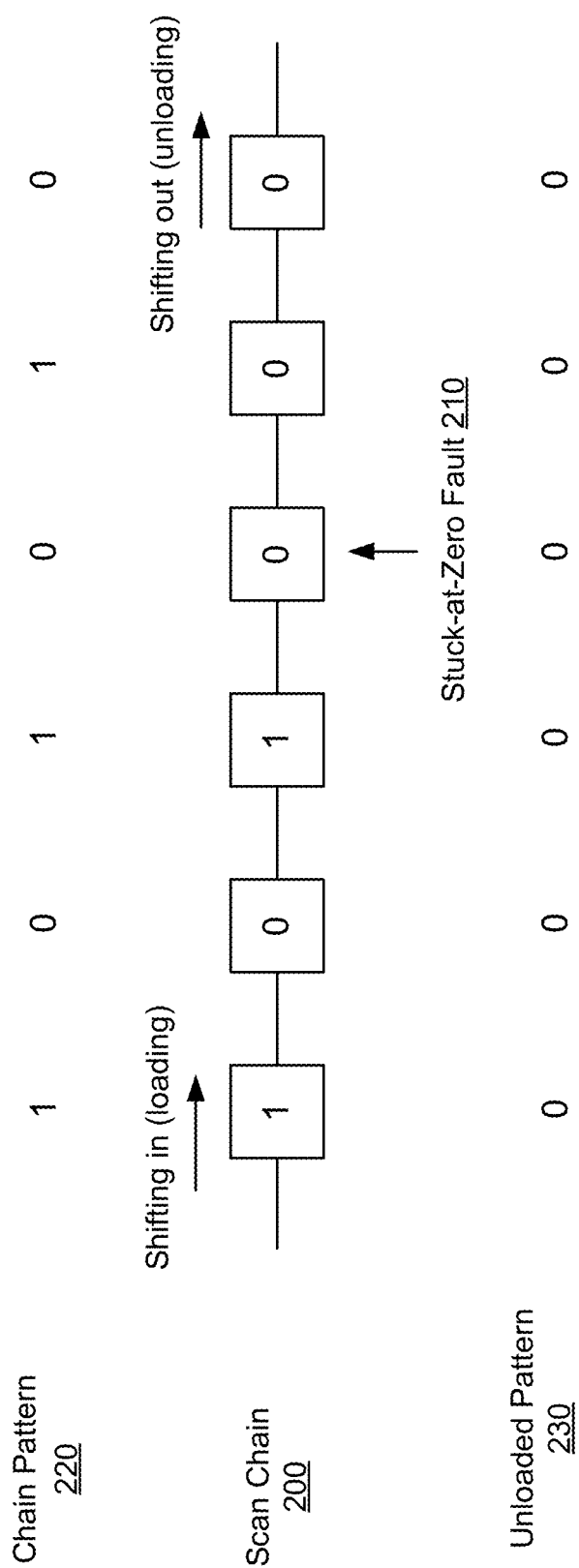
FIG. 2 illustrates an example of using chain patterns to identify faulty scan chains and their associated fault models.

FIG. 2 illustrates an example of using chain patterns to identify faulty scan chains and their associated fault models. A scan chain 200 is a faulty scan chain with a stuck-at-zero fault 210 located at one of its scan cells. A chain pattern 220, "101010," is shifted into the scan chain 200. Due to the stuck-at-zero fault 210, bits at and after the faulty scan cell become all zeros and the shifted-in (or loaded) pattern becomes "101000." When the shifted-in pattern is being shifted out, the stuck-at-zero fault 210 causes the bits before the faulty scan cell becomes all zeros, forming the unloaded pattern 230, "000000." If a scan chain has no defect, the unloaded pattern should be the same as the original chain pattern. Thus, a comparison of the unloaded pattern with the original pattern indicates whether the scan chain is faulty or not.

Different fault types can lead to different unloaded patterns. An analysis of the unloaded patterns can determine which fault type the faulty scan chain is associated with. FIG. 3 lists unloaded patterns for eight permanent fault models and eight intermittent fault models obtained by shifting in and out a chain pattern ("001100110011"). Using conventional methods, however, chain patterns alone usually cannot locate the faulty scan cell.

Figure 4:
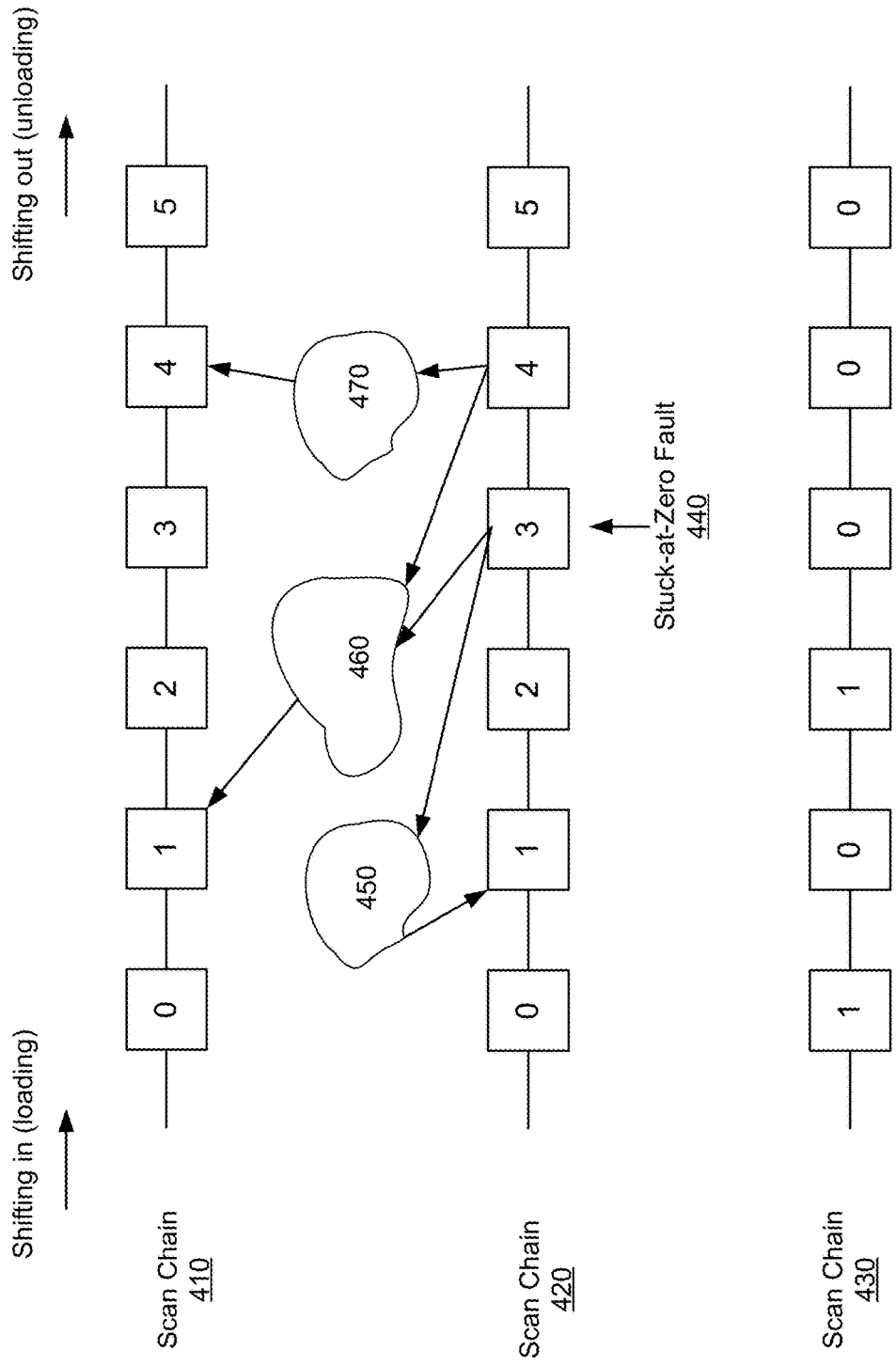
FIG. 4 illustrates an example of three scan chains, of which one has a fault.
Figure 5:
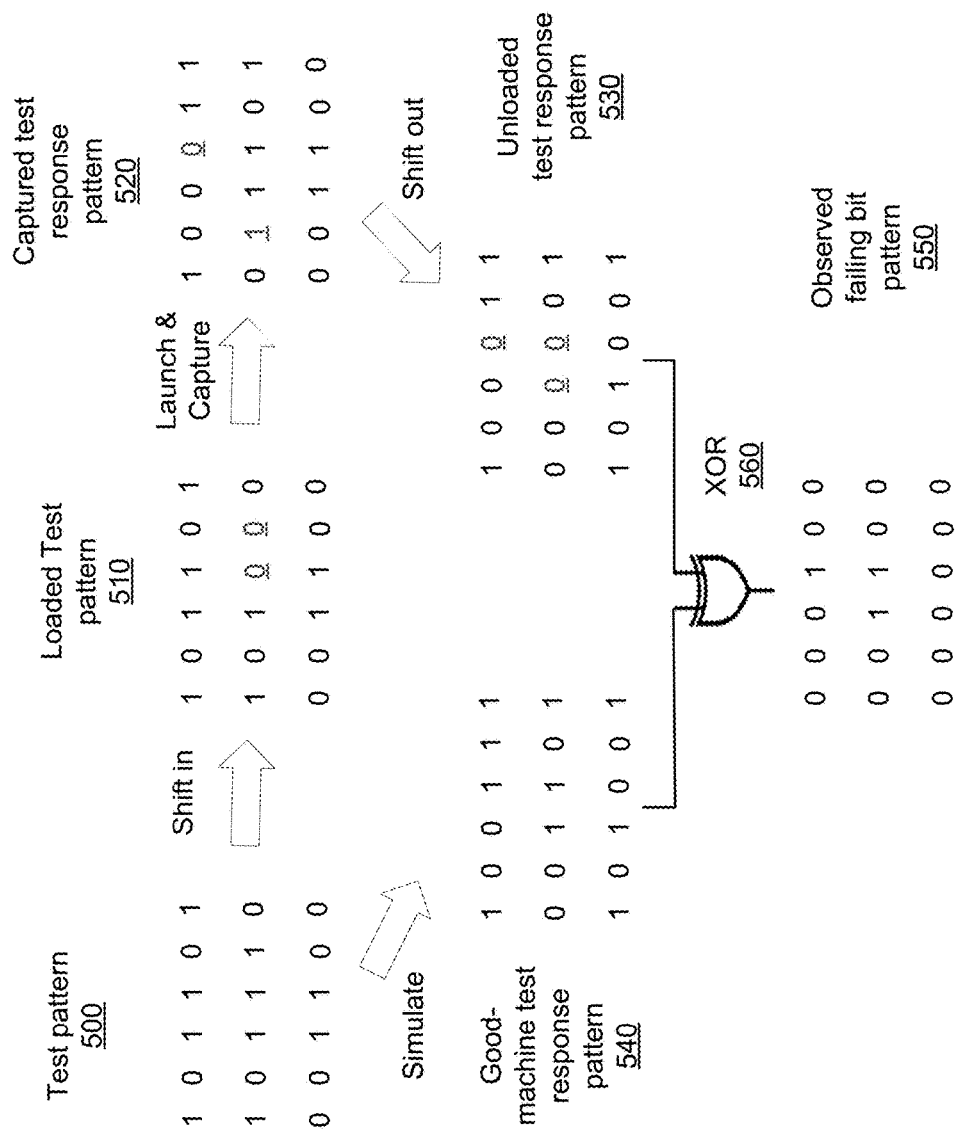
FIG. 5 illustrates an example of using scan patterns to identify faulty scan cells or faulty scan cell suspects for the faulty scan chain shown in FIG. 4.

FIGS. 4 and 5 illustrates an example of using scan patterns to identify faulty scan cells or faulty scan cell suspects. FIG. 4 shows three scan chains 410, 420 and 430, among which the scan chain 420 is defective. The scan cells on each of the scan chains are numbered from "0" to "5" with the scan shift direction from low numbers to high numbers. On the scan chain 420, scan cell #3 has a stuck-at-zero fault 440. FIG. 5 illustrates a test pattern 500 and its various derivative patterns formed/predicted from scan shift, capture, simulation and comparison operations, respectively. After the test pattern 500 is shifted into the scan chains, a loaded test pattern 510 is formed. Due to the stuck-at-zero fault 440, the bits loaded in scan cells #3 and #4 change their values from "1" to "0." After one or more capture clock cycles, the scan cells on the three scan chains capture the test response to the loaded test pattern 510. The captured test response bits form a captured test response pattern 520. A good-machine simulation can determine an expected good-machine test response pattern 540 if the scan chains 410-430 have no defect.

A comparison of the captured test response pattern 520 with the good-machine test response pattern 540 shows that scan cell #4 on the scan chain 410 and scan cell #1 on the scan chain 420 both capture values different from the good-machine values. These failing bits are caused by the wrong loaded values loaded in scan cells #3 and #4 on the scan chain 420, respectively. As FIG. 4 shows, the scan cell #3 on the scan chain 420 is connected to the scan cell #1 on the scan chain 420 through logic circuitry 450; and the scan cell #4 on the scan chain 420 is connected to the scan cell #4 on the scan chain 410 through logic circuitry 470. These two logic paths are responsible for the failing bits, respectively.

Most of the bits of the captured test response pattern 520 have the same values as the corresponding ones of the good-machine test response pattern 540. This may be because the scan cells have no paths connecting them to the scan cells loaded with wrong values. An alternative reason may be that the paths connecting the scan cells to the scan cells loaded with wrong values are not activated. An example of the latter case is shown in FIG. 4. While the wrong value loaded in scan cell #3 on the scan chain 420 can potentially affect the captured value in scan cell #1 on the scan chain 410 through a logic circuit 460, the path is blocked by the wrong value loaded in the scan cell #4 on the scan chain 420. As a result, scan cell #1 on the scan chain 410 captures a value conforming to a good-machine value.

The captured test response pattern 520 is not the observed pattern. After shifting out, the captured test response pattern 520 changes to an unloaded test response pattern 530. Three bits of the unloaded test response pattern 530 have values different from the corresponding bits of the good-machine test response pattern 540. These failing bits are represented by "1s" in an observed failing bit pattern 550. It should be noted that an observed failing bit pattern can alternatively use "0s" for failing bits and "1s" for "good" bits.

The observed failing bit pattern 550 can be treated as being obtained by combining the unloaded test response pattern 530 and the good-machine test response pattern 540 through an XOR gate 560. The failing bits of the observed failing bit pattern 550 is different from those of the captured test response pattern 520. Specifically, the failing bits on the faulty scan chain are different between the observed failing bit pattern 550 and the captured test response pattern 520. Because of the stuck-at-zero fault 440, two "good" bits (captured by scan cells #2 and #3) becomes failing bits while a failing bit (captured by scan cell #1) becomes a "good" bit.

Each test pattern can generate an observed failing bit pattern. Based on these observed failing bit patterns, faulty scan cells or faulty scan cell suspects may be identified. As discussed above, however, the relationship between the observed failing bit patterns and the faulty scan cell is complicated. Failing bits in the loaded test pattern 510 may lead to or not lead to failing bits in the captured test response pattern 520; and the failing bits in the captured test response pattern 520 may be or may not be failing bits in the observed failing bit pattern 550. Moreover, the intermittent fault models can further increase the complexity of identifying faulty scan cells or faulty scan cell suspects. A carefully-designed machine-learning approach could be employed to tackle the problem.

Figure 6:
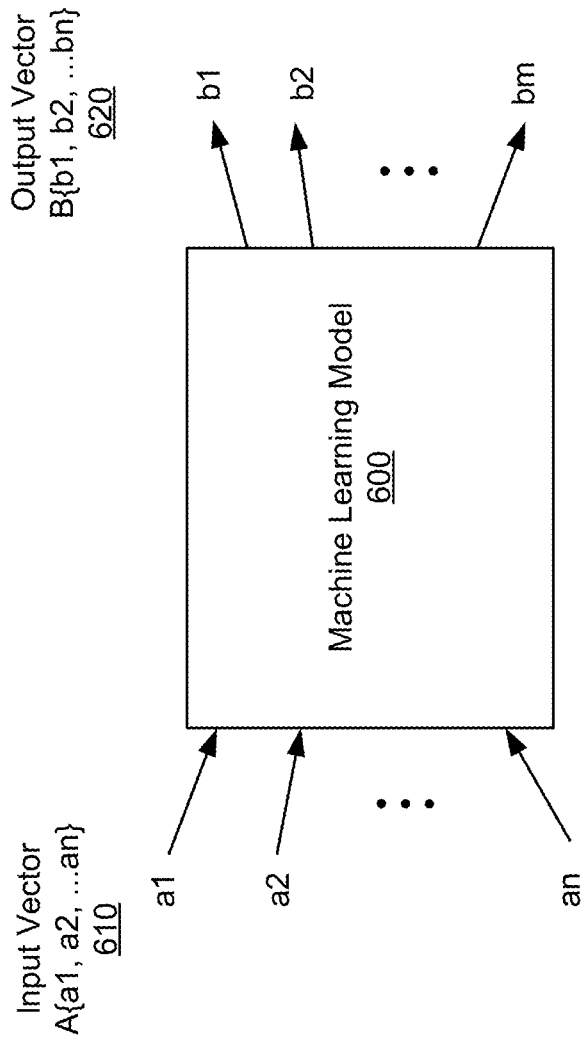
FIG. 6 illustrates an example of a machine-learning model for chain diagnosis that may be employed according to various embodiments of the disclosed technology.

FIG. 6 illustrates an example of a machine-learning model for chain diagnosis that may be employed according to various embodiments of the disclosed technology. A machine learning model 600 has an input vector A (610). The input vector A (610) has vector components a1 through an, which are derived based on the observed failing bit patterns. The machine learning model 600 also has an output vector B (620). The output vector B (620) has vector components b1 through bm, which provide faulty probability values or equivalents for individual scan cells of the faulty scan chain. The machine learning model 600 is a supervised machine learning model and is derived using training samples.

Figure 7:
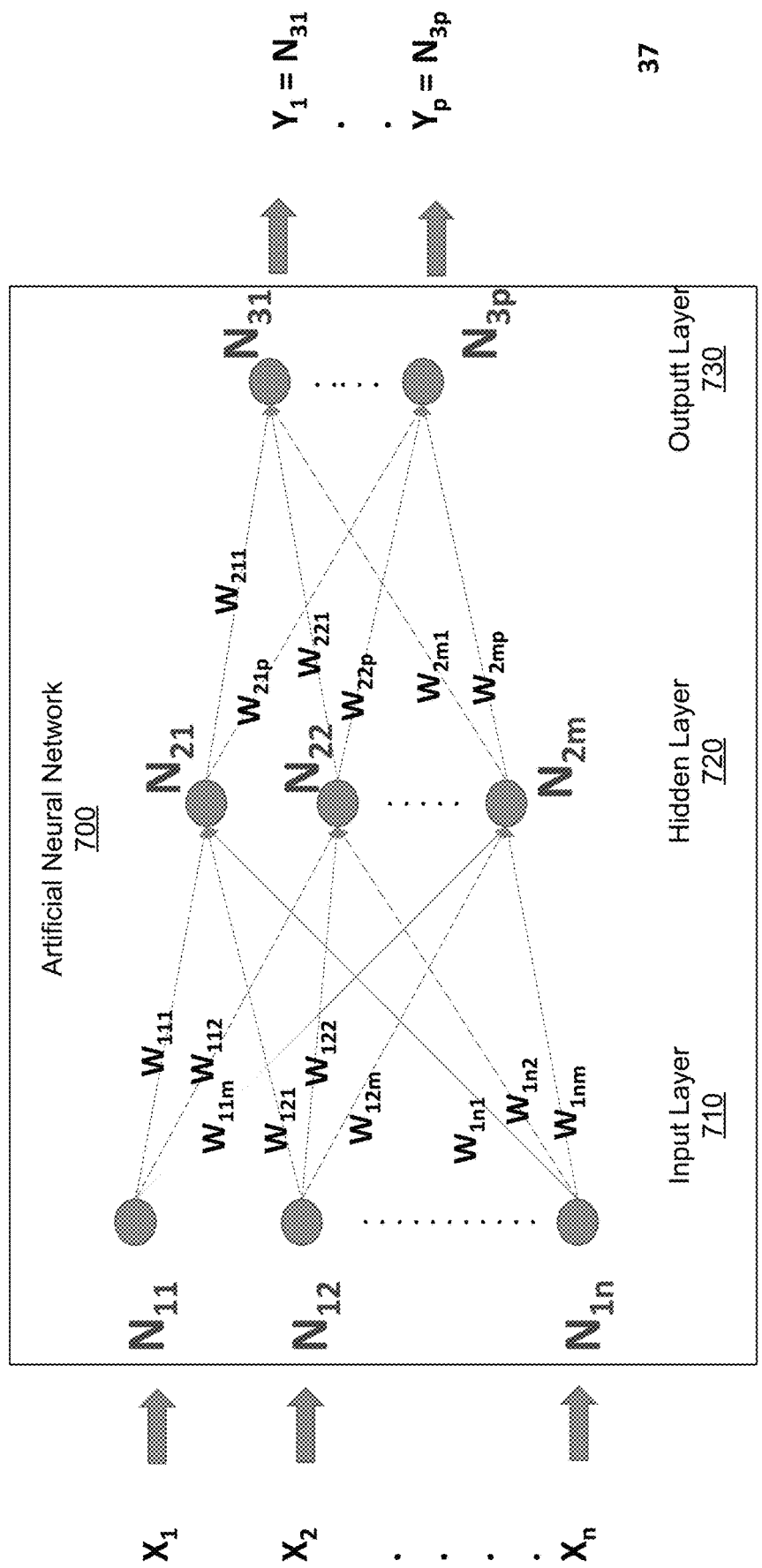
FIG. 7 illustrates an example of an artificial neural network that may be employed as the machine learning model shown in FIG. 6 according to some embodiments of the disclosed technology.

FIG. 7 illustrates an example of an artificial neural network 700 that may be employed as the machine learning model 600 according to some embodiments of the disclosed technology. The artificial neural network 700 has three layers of neurons: an input layer 710, an output layer 730 and a hidden layer 720. In a fully-connected network, each neuron is connected to all of the neurons in its adjacent layer(s). In general, a neuron performs the computation in two steps: 1) a weighted sum of the values it receives from the previous layer, using the weights of the associated connections, and 2) a nonlinear activation function applied to the weighted sum. An artificial neural network can have zero or multiple hidden layers.

According to various implementations of the disclosed technology, the machine learning model 600 is derived through a supervised training process driven by a large amount of failure information in response to various assumed candidate faults. In the case of an artificial neural network, the weights of connections in the artificial neural network are first initialized (e.g., with a small random number) before the training process starts, and then each of these weights converges to a value when the training process completes. After the machine learning model 600 is trained, it can then be used to perform inference (i.e., determining the most probable fault location(s) in the failed scan chain).

Figure 8:
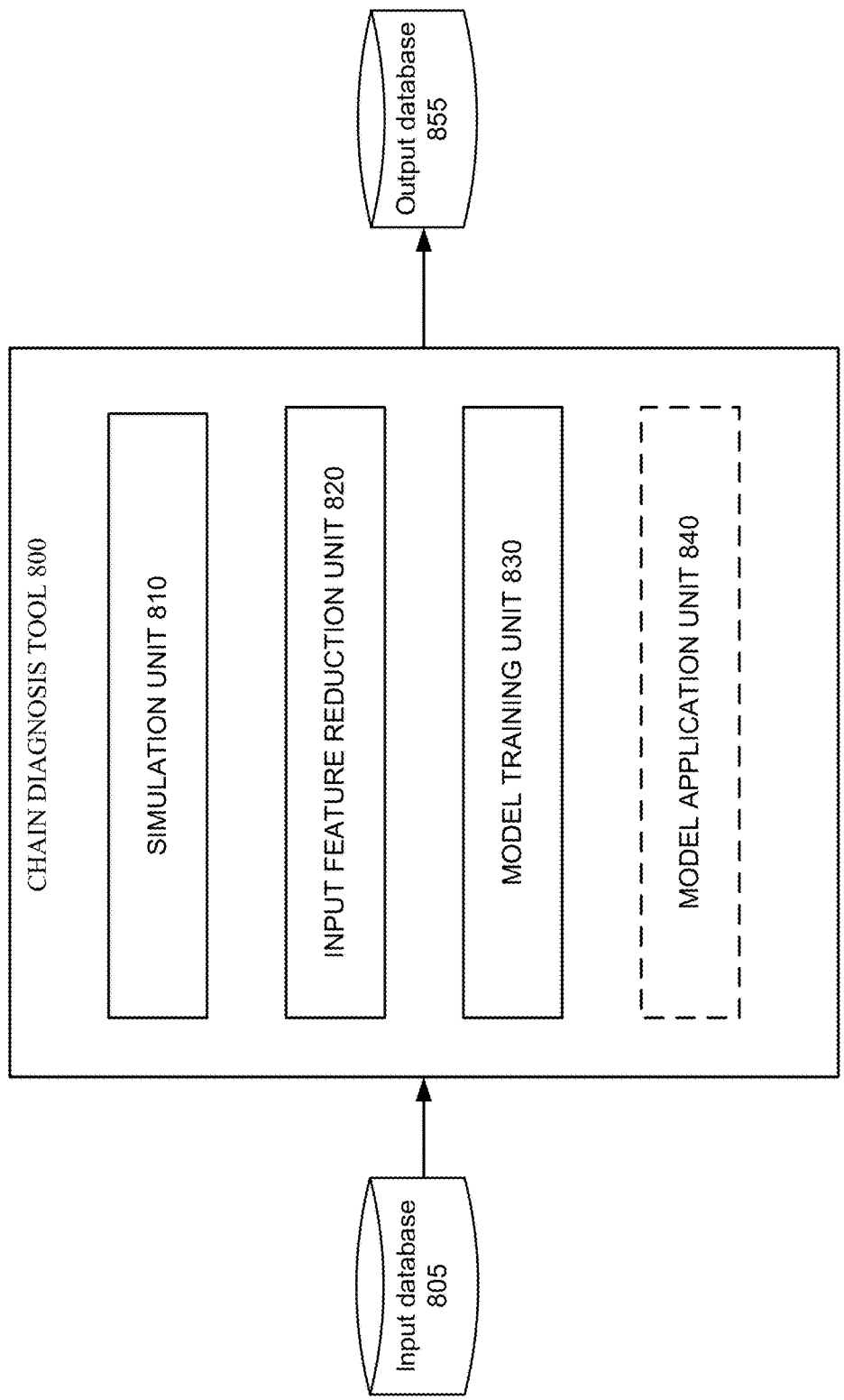
FIG. 8 illustrates an example of a chain diagnosis tool that may be implemented according to various embodiments of the disclosed technology.

FIG. 8 illustrates an example of a chain diagnosis tool 800 that may be implemented according to various embodiments of the disclosed technology. As seen in this figure, the chain diagnosis tool 800 includes a simulation unit 810, an input feature reduction unit 820, and a model training unit 830. Some implementations of the chain diagnosis tool 800 may cooperate with (or incorporate) one or more of a model application unit 840, an input database 805, and an output database 855.

As will be discussed in more detail below, the chain diagnosis tool 800 receives a circuit design and test patterns for testing circuits manufactured based on the circuit design. The simulation unit 810 injects a fault into one of scan chains in the circuit design and performs a simulation to determine a test response patent in response to a test pattern which is captured by the scan chains. The simulation unit 810 then determines an unloaded test response pattern based on shifting the test response pattern out of the scan chains. The simulation unit 810 determines an observed failing bit pattern based on comparing the unloaded test response pattern with a good-machine test response pattern. The simulation unit 810 repeats the above process for various faults (and maybe with various fault probabilities) and for all of the test patterns. The input feature reduction unit 820 performs bit-reduction on the observed failing bit patterns for each of the fault injections to construct training samples. The model training unit 830 trains machine-learning models with the training samples. The chain diagnosis tool 800 stores the trained machine learning models in the output database 855. The model application unit 840 can use the trained machine-learning models to identify defective scan cell candidates for circuits failing manufacture testing.

As previously noted, various examples of the disclosed technology may be implemented by one or more computing systems, such as the computing system illustrated in FIG. 1. Accordingly, one or more of the simulation unit 810, the input feature reduction unit 820, the model training unit 830, and the model application unit 840 may be implemented by executing programming instructions on one or more processors in one or more computing systems, such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or more of the simulation unit 810, the input feature reduction unit 820, the model training unit 830, and the model application unit 840. As used herein, the term "non-transitory computer-readable medium" refers to computer-readable medium that are capable of storing data for future retrieval and not propagating electro-magnetic waves. The non-transitory computer-readable medium may be, for example, a magnetic storage device, an optical storage device, or a solid state storage device.

It also should be appreciated that, while the simulation unit 810, the input feature reduction unit 820, the model training unit 830, and the model application unit 840 are shown as separate units in FIG. 8, a single computer (or a single processor within a master computer) or a single computer system may be used to implement all of these units at different times, or components of these units at different times.

With various examples of the disclosed technology, the input database 805 and the output database 855 may be implemented using any suitable computer readable storage device. That is, either of the input database 805 and the output database 855 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 805 and the output database 855 are shown as separate units in FIG. 8, a single data storage medium may be used to implement some or all of these databases.

Figure 9:
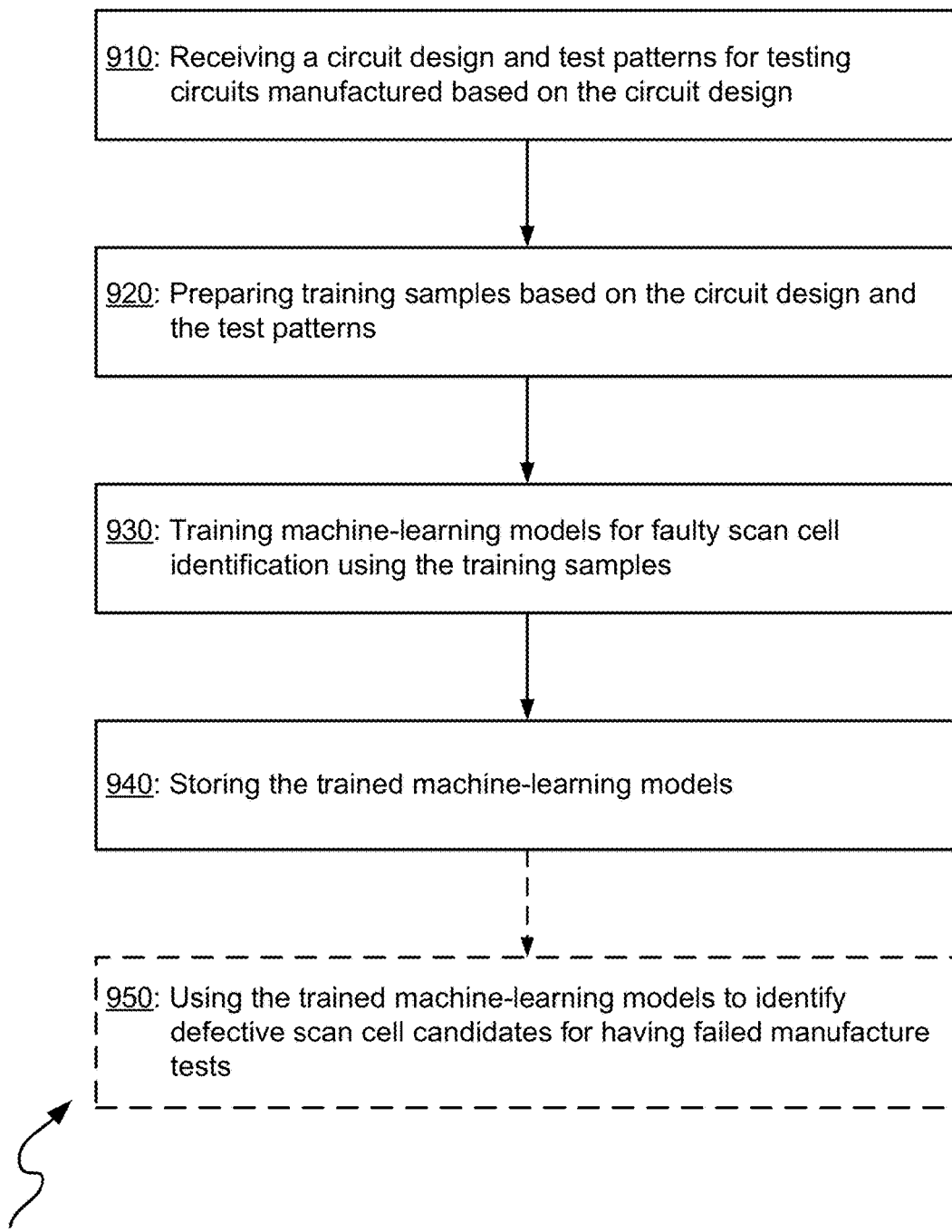
FIG. 9 illustrates a flowchart showing a process of machine learning-based chain diagnosis that may be implemented according to various examples of the disclosed technology.
Figure 10:
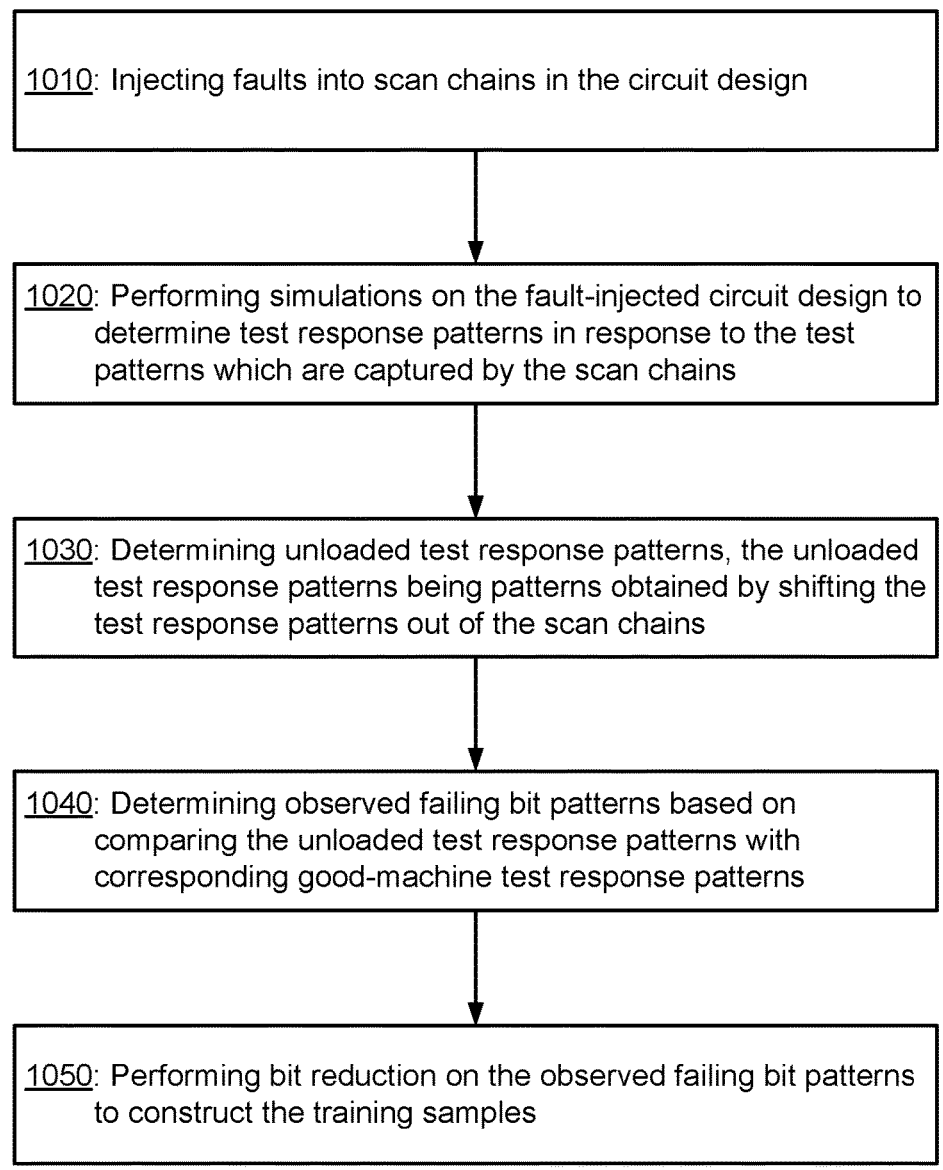
FIG. 10 illustrates a flowchart showing a process for preparing machine learning model training samples that may be implemented according to various examples of the disclosed technology.

FIG. 9 illustrates a flowchart 900 showing a process of machine learning-based chain diagnosis that may be implemented according to various examples of the disclosed technology. FIG. 10 illustrates a flowchart 1000 showing a process for preparing machine learning model training samples that may be implemented according to various examples of the disclosed technology. For ease of understanding, methods of machine learning-based chain diagnosis that may be employed according to various embodiments of the disclosed technology will be described with reference to the chain diagnosis tool 800 illustrated in FIG. 8 and the flow chart 900 in FIG. 9 and the flow chart 1000 in FIG. 10. It should be appreciated, however, that alternate implementations of a chain diagnosis tool may be used to perform the method of machine learning-based chain diagnosis illustrated in the flow charts 900 and 1000 according to various embodiments of the disclosed technology. In addition, it should be appreciated that implementations of the chain diagnosis tool 800 may be employed to implement methods of machine learning-based chain diagnosis according to different embodiments of the disclosed technology other than the one illustrated by the flow charts 900 and 1000.

In operation 910, the chain diagnosis tool 800 receives a circuit design and test patterns for testing circuits manufactured based on the circuit design. The circuit design may be a design for a whole chip or may represent a block or a core in a larger design. The test patterns may be generated in a conventional automatic test pattern generation (ATPG) process. The test patterns may be a whole or a subset of test patterns generated for testing circuits.

In operation 920, the chain diagnosis tool 800 prepares training samples based on the circuit design and the test patterns. The preparation comprises a process illustrated by the flow chart 1000 in FIG. 10. In operation 1010, the simulation unit 810 injects faults into scan chains in the circuit design. In operation 1020, the simulation unit 810 performs simulations on the fault-injected circuit design to determine test response patterns in response to the test patterns which are captured by the scan chains. In operation 1030, the simulation unit 810 determines unloaded test response patterns. The unloaded test response patterns are patterns obtained by shifting the test response patterns out of the scan chains. In operation 1040, the simulation unit 810 determines observed failing bit patterns based on comparing the unloaded test response patterns with corresponding good-machine test response patterns.

In some embodiments of the disclosed technology, the simulation unit 810 injects one fault to a scan cell on a scan chain of interest and then conducts simulations for all of the test patterns. The fault may be an intermittent fault. The fault intermittency may be represented by the probability that a modeled fault is activated during a scan test operation. Accordingly, the simulation unit 810 may inject one fault with one fault intermittency value for simulating all of the test patterns. To perform comprehensive fault modeling, the simulation unit 810 may use integer fault intermittency values i.e. 1%, 2%, 3%, . . . , 100%. The injection of a fault with a fault intermittency value can be performed by a commercially available tool such as those in the Tessent family of software tools available from Mentor Graphics Corporation, Wilsonville, Oreg.

Assume the number of scan cells on the scan chain of interest is n, the number of the test patterns is m, and the number of fault intermittency values used is k. The total number of simulations needed for a particular scan chain injected with a particular fault model is $n*m*k$. This is also the total number of the observed failing bit patterns. Using the observed failing bit patterns for each fault injection directly, the number of components of the input vector for the machine learning models will be n*p*m, where p is the number of scan chains. Typically, m is in the order of $5\times10^3$, n is in the order of $10^2$, and p is in the order of $10^5$ for a large design. As such, the input vector can have more than $10^{10}$ components. Training machine models having such a large input vector is impractical because it requires enormous computing resources and time. Accordingly, in operation 1050 of the flow chart 1000, the input feature reduction unit 820 performs bit-reduction on the observed failing bit patterns for preparing training samples.

With various implementations of the disclosed technology, the bit-reduction comprises: combining, for each of the fault injections, corresponding bits associated with good scan chains across the observed failing bit patterns or bits within each of the observed failing bit patterns and being associated with scan cells on each of good scan chains. The former may be referred to as pattern-based bit compression and the latter as cycle-based bit compression. The good scan chains are scan chains in which no fault is injected. The bit-reduction may further comprises: combining, for each of the fault injections, corresponding bits associated with the faulty scan chain across the observed failing bit patterns or bits in each of the observed failing bit patterns and being associated with the faulty scan chain.

Figure 11:
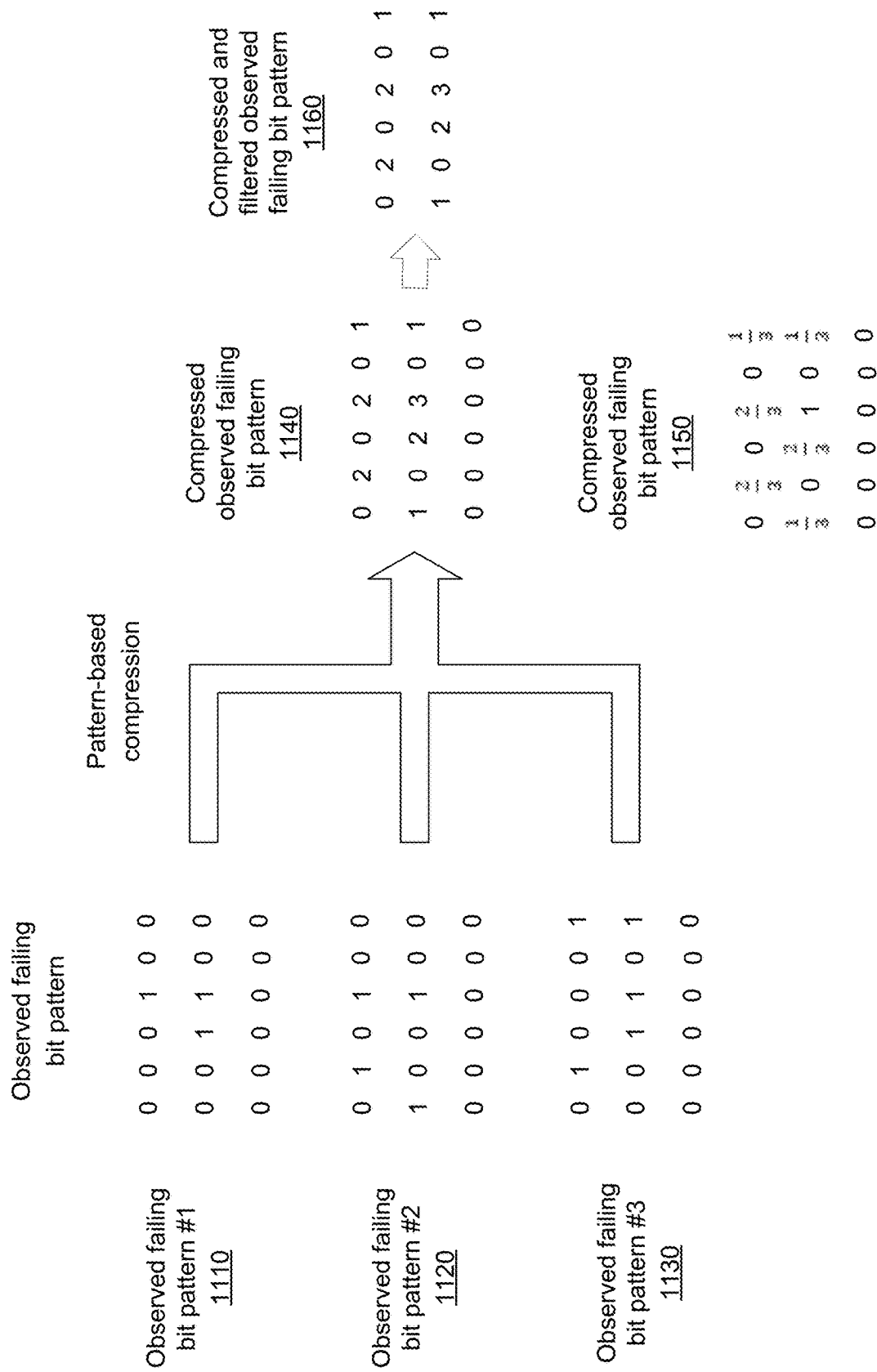
FIG. 11 illustrates examples of pattern-based bit compression for both good and faulty scan chains according to various embodiments of the disclosed technology.

FIG. 11 illustrates examples of pattern-based bit compression for both good and faulty scan chains according to various embodiments of the disclosed technology. The figure shows three observed failing bit patterns 1110, 1120 and 1130 associated with the scan chains shown in FIG. 4. Here, the bit combination can be based on bit value addition. The result is a compressed observed failing bit pattern 1140. Alternatively, the pattern-based bit compression can be based on calculating the bit failing probability. The result is a compressed observed failing bit pattern 1150. It should be noted that the compressed observed failing bit patterns 1140 and 1150 are just two examples and that there are other ways for the bit combination which can lead to different compressed observed failing bit patterns.

Figure 12:
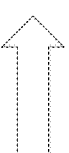
FIG. 12 illustrates examples of cycle-based bit compression for both good and faulty scan chains according to various embodiments of the disclosed technology.

FIG. 12 illustrates examples of cycle-based bit compression for both good and faulty scan chains according to various embodiments of the disclosed technology. The figure shows three observed failing bit patterns 1210, 1220 and 1230 associated with the scan chains shown in FIG. 4. Here, the bit combination can be based on bit value addition. The result is a compressed observed failing bit pattern 1240. Alternatively, the cycle-based bit compression can be based on calculating the bit failing probability for each scan chain. The result is a compressed observed failing bit pattern 1250. It should be noted that the compressed observed failing bit patterns 1240 and 1250 are just two examples and that there are other ways for the bit combination which can lead to different compressed observed failing bit patterns.

In addition to the pattern-based or cycle-based bit compression for good scan chains or for all scan chains, the bit-reduction may further comprise bit filtering with respect to the good scan chains. The input feature reduction unit 820 may remove bits of the compressed observed failing bit patterns that are associated with scan cells that have no logic path to any scan cells on the faulty scan chain. Assume scan cells on the scan chain 430 in FIG. 4 have no logic path to any scan cells on the faulty scan chain 420. The input feature reduction unit 820 can generate a compressed and filtered observed failing bit pattern 1160 in the example shown in FIG. 11. Alternatively, the input feature reduction unit 820 may remove bits that never fail for any of the test patterns or for any of the fault injections into a faulty scan chain from the training samples construction.

Figure 13:
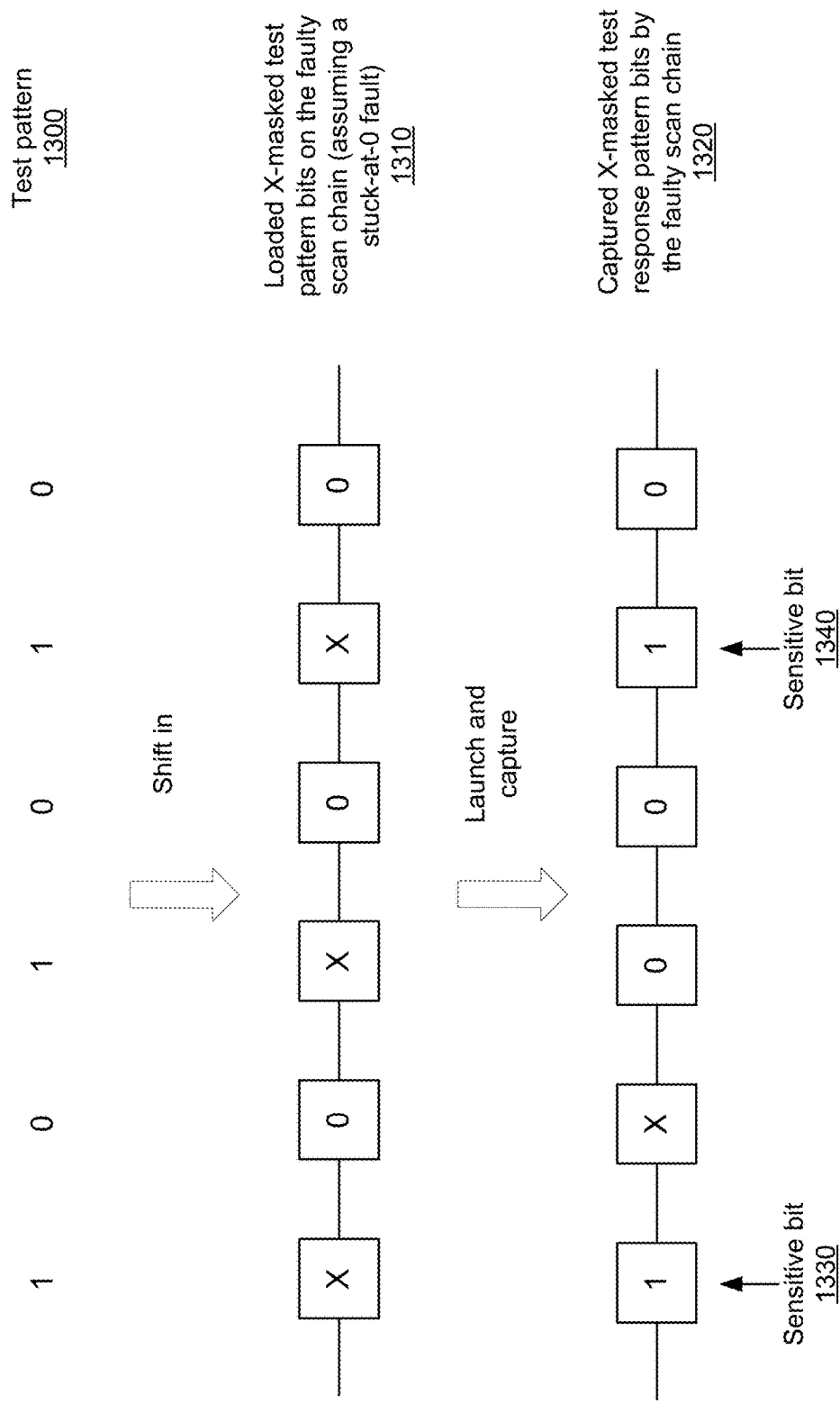
FIG. 13 illustrates an example of sensitive bit identification according to various embodiments of the disclosed technology.

Alternatively or additionally, the input feature reduction unit 820 may perform the bit filtering with respect to the faulty scan chain by keeping only sensitive bits for constructing the input vector for the machine learning models. Sensitive bits are identified by first masking bits of a test pattern that are susceptible to loading errors with an X and then performing a simulation to generate a captured test response pattern. Sensitive bits are bits of the captured test response pattern that are susceptible to unloading errors. FIG. 13 illustrates an example of sensitive bit identification according to various embodiments of the disclosed technology. Bits associated with the faulty scan chain of a test pattern 1300 are shown as "101010." After being loaded, all bits with a value of "1" is replaced with an "X" to become "X0X0X0" (a loaded X-masked test pattern 1310), assuming the faulty scan chain has a stuck-at-zero fault. A simulation determines bits of a captured X-masked test response pattern 1320 on the faulty scan chain. Because a bit has a value of "1" is susceptible to loading errors, two sensitive bits 1330 and 1340 are thus identified.

After the bit-reduction, the input feature reduction unit 820 can construct training samples by assigning bits of a compressed observed failing bit pattern or a compressed and filtered observed failing bit pattern to components of the input vector for the machine learning models.

Refer back to the flow chart 900 in FIG. 9. In operation 930, the model training unit 830 trains the machine-learning models using the training samples. One machine learning model may be trained for one scan chain having one specific fault type. The machine-learning models may be artificial neural networks. In this case, the training can establish the final weights of the connections between the neurons. When the training is completed, each training sample should produce a value for the output neurons that is close to the label, for most cases. An artificial neural network has a loss function associated with it which quantifies how well the trained artificial neural network performs on training samples. The objective of training is to minimize the loss function.

In operation 940, the chain diagnosis tool 800 stores the trained machine-learning models in the output database 855.

Optionally, in operation 950, the model application unit 840 uses the trained machine-learning models to identify defective scan cell candidates for circuits having failed manufacture tests. Based on the specific types of faults associated with the specific scan chains in these circuits, the machine-learning models are selected. The unloaded test response patterns may be analyzed to generate observed failing bit patterns, which are then processed using the bit reduction like the one for preparing the training samples. The resulted input vectors are applied to the selected machine-learning models.

Based on the defective scan cell candidates, defects in one or more of the circuits having failed manufacture tests may be located using various analysis/tools such as a physical failure analysis tool. The results may be used to help identify the root causes for the defects. The identified root causes can be used for adjusting the manufacturing process and/or manufacturing equipment to improve/maintain the yield. Alternatively or additionally, the circuit design may be modified based on the confirmed root causes to improve the yield.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, executed by at least one processor of a computer, comprising:
   receiving a circuit design and test patterns for testing circuits manufactured based on the circuit design;
   preparing training samples based on the circuit design and the test patterns, comprising:
      injecting faults into scan chains in the circuit design,
      performing simulations on the fault-injected circuit design to determine test response patterns in response to the test patterns, the test response patterns being captured by the scan chains,
      determining unloaded test response patterns, the unloaded test response patterns being patterns obtained by shifting the test response patterns out of the scan chains,
      determining observed failing bit patterns based on comparing the unloaded test response patterns with corresponding good-machine test response patterns, and
      performing bit-reduction on the observed failing bit patterns for each of the fault injections to construct the training samples, the bit-reduction comprising pattern-based bit compression or cycle-based bit compression for each of the scan chains;
   training machine-learning models for faulty scan cell identification using the training samples; and
   storing the trained machine-learning models.

2. The method recited in claim 1, further comprising:
   using the trained machine-learning models to identify defective scan cell candidates for circuits having failed manufacture tests; and
   locating defects in one or more of the circuits having failed manufacture tests based on the defective scan cell candidates.

3. The method recited in claim 2, wherein the locating comprises:
   using a physical failure analysis tool to analyze the one or more of the circuits having failed manufacture tests.

4. The method recited in claim 1, wherein the bit-reduction further comprises bit filtering.

5. The method recited in claim 4, wherein the bit filtering comprises:
   removing bits of the compressed observed failing bit patterns that are associated with scan cells that have no logic path to any scan cells on a faulty scan chain from the training samples construction.

6. The method recited in claim 4, wherein the bit filtering comprises:
   removing bits that never fail for any of the test patterns or for any of the fault injections into a faulty scan chain from the training samples construction.

7. The method recited in claim 4, wherein the bit filtering comprises:
   keeping only sensitive bits on faulty scan chains for the training samples construction, the faulty scan chains being scan chains with the faults being injected into.

8. The method recited in claim 1, wherein the combining in the pattern-based bit compression and in the cycle-based bit compression comprises:
   performing bit addition, wherein the observed failing bit patterns use "1" and "0" to represent a failing bit and a non-failing bit, respectively.

9. The method recited in claim 1, wherein the combining in the pattern-based bit compression and in the cycle-based bit compression comprises:
   computing observed bit failing probability values based on the observed failing bit patterns.

10. The method recited in claim 1, wherein the machine-learning models are Artificial Neural Networks.

11. The method recited in claim 1, wherein the faults are represented by fault types and fault probabilities.

12. One or more non-transitory computer-readable media storing computer-executable instructions for causing one or more processors to perform a method, the method comprising:
    receiving a circuit design and test patterns for testing circuits manufactured based on the circuit design;
    preparing training samples based on the circuit design and the test patterns, comprising:
       injecting faults into scan chains in the circuit design,
       performing simulations on the fault-injected circuit design to determine test response patterns in response to the test patterns, the test response patterns being captured by the scan chains,
       determining unloaded test response patterns, the unloaded test response patterns being patterns obtained by shifting the test response patterns out of the scan chains,
       determining observed failing bit patterns based on comparing the unloaded test response patterns with corresponding good-machine test response patterns, and
       performing bit-reduction on the observed failing bit patterns for each of the fault injections to construct training samples, the bit-reduction comprising pattern-based bit compression or cycle-based bit compression for each of the scan chains
    training machine-learning models for faulty scan cell identification using the training samples; and
    storing the trained machine-learning models.

13. The one or more non-transitory computer-readable media recited in claim 12, wherein the method further comprises:
    using the trained machine-learning models to identify defective scan cell candidates for circuits having failed manufacture tests.

14. The one or more non-transitory computer-readable media recited in claim 13, wherein the bit-reduction further comprises bit filtering.

15. The one or more non-transitory computer-readable media recited in claim 14, wherein the bit filtering comprises:
    removing bits of the compressed observed failing bit patterns that are associated with scan cells that have no logic path to any scan cells on a faulty scan chain from the training samples construction.

16. The one or more non-transitory computer-readable media recited in claim 14, wherein the bit filtering comprises:

removing bits that never fail for any of the test patterns or for any of the fault injections into a faulty scan chain from the training samples construction.

17. The one or more non-transitory computer-readable media recited in claim 14, wherein the bit filtering comprises:
   keeping only sensitive bits on faulty scan chains for the training samples construction, the faulty scan chains being scan chains with the faults being injected into.

18. The one or more non-transitory computer-readable media recited in claim 12, wherein the combining in the pattern-based bit compression and in the cycle-based bit compression comprises:
   performing bit addition, wherein the observed failing bit patterns use "1" and "0" to represent a failing bit and a non-failing bit, respectively.

19. The one or more non-transitory computer-readable media recited in claim 12, wherein the combining in the pattern-based bit compression and in the cycle-based bit compression comprises:
   computing observed bit failing probability values based on the observed failing bit patterns.

20. The one or more non-transitory computer-readable media recited in claim 12, wherein the machine-learning models are Artificial Neural Networks.

21. The one or more non-transitory computer-readable media recited in claim 12, wherein the faults are represented by fault types and fault probabilities.

\* \* \* \* \*